(12) United States Patent
Shen et al.

(10) Patent No.: US 8,669,569 B2
(45) Date of Patent: Mar. 11, 2014

(54) LIGHT EMITTING DIODE PACKAGE AND METHOD FOR FABRICATING THE SAME

(76) Inventors: Yu-Nung Shen, Taipei (TW);
Tsung-Chi Wang, Taipei (TW)

(\*) Notice: Subject to any disclaimer, the term of this patent is extended or adjusted under 35 U.S.C. 154(b) by 76 days.

(21) Appl. No.: 13/251,442

(22) Filed: Oct. 3, 2011

(65) Prior Publication Data

US 2012/0018760 A1 Jan. 26, 2012

Related U.S. Application Data

(63) Continuation-in-part of application No. 12/700,062, filed on Feb. 4, 2010, now Pat. No. 8,242,517.

(30) Foreign Application Priority Data

Oct. 5, 2010 (TW) .............................. 99133955 A

(51) Int. Cl.
*H01L 33/00* (2010.01)

(52) U.S. Cl.
USPC .......... 257/88; 257/84; 257/98; 257/E33.058; 257/E33.061

(58) Field of Classification Search
USPC ..................... 257/13, 79–103, 918, 257/E51.018–E51.022, E33.001–E33.077, 257/E33.054, E25.028, E25.03
See application file for complete search history.

(56) References Cited

U.S. PATENT DOCUMENTS

| | | | | |
|---|---|---|---|---|
| 2005/0110157 A1* | 5/2005 | Sherrer et al. | ................ | 257/776 |
| 2007/0166853 A1* | 7/2007 | Guenther et al. | ............... | 438/26 |
| 2009/0166653 A1* | 7/2009 | Weaver et al. | ................. | 257/98 |
| 2009/0261365 A1* | 10/2009 | Brunner et al. | ................. | 257/98 |
| 2009/0262526 A1* | 10/2009 | Lin et al. | ....................... | 362/231 |

\* cited by examiner

*Primary Examiner* — Mamadou Diallo
(74) *Attorney, Agent, or Firm* — Nixon & Vanderhye P.C.

(57) ABSTRACT

A method for fabricating light emitting diode packages includes: providing a light emitting diode wafer which has a plurality of light emitting diode chips, each of the light emitting diode chips including a semiconductor unit that has p-type and n-type electrode regions, and two electrodes; forming a light-transmissive insulating layer on the light emitting diode chips; forming a reflective metal layer on a portion of the light-transmissive insulating layer; forming a layer of insulating material on the light-transmissive insulating layer and the reflective metal layer, and performing exposing and developing treatments to form the layer of insulating material into a plurality of protective insulating structures; forming a conductor-receiving insulating layer on the light-transmissive insulating layer and the protective insulating structures; and performing a cutting process to obtain a plurality of light emitting diode packages each having at least one of the light emitting diode chips.

12 Claims, 5 Drawing Sheets

LIGHT EMITTING DIODE PACKAGE AND METHOD FOR FABRICATING THE SAME

CROSS-REFERENCE TO RELATED APPLICATION

This application is a continuation-in-part (CIP) of U.S. patent application Ser. No. 12/700,062, filed on Feb. 4, 2010 now U.S. Pat. No. 8,242,517, and claims priority of Taiwanese application no. 099133955, filed on Oct. 5, 2010.

BACKGROUND OF THE INVENTION

1. Field of the Invention

This invention relates to a light emitting diode package and a method for fabricating the same.

2. Description of the Related Art

In recent years, there is a tendency to replace a conventional light source in electronic devices, lighting equipments, etc., with a light emitting diode (LED). However, an LED package is mainly formed using a wire-bonding method which is time-consuming. Besides, the heat-dissipation property of bonding wires in the LED package is poor, thereby adversely affecting the luminance and service life of the LED package.

SUMMARY OF THE INVENTION

Therefore, an object of the present invention is to provide a light emitting diode package and a method for fabricating the same that can overcome the aforesaid drawbacks associated with the prior art.

According to a first aspect of this invention, a method for fabricating light emitting diode packages comprises:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surface, the light-transmissive insulating layer being subjected to exposing and developing treatments to form a plurality of via holes that respectively expose the electrodes of the light emitting diode chips;

forming a reflective metal layer on a portion of the light-transmissive insulating layer corresponding to the p-type electrode regions of the light emitting diode chips;

forming a layer of insulating material on the light-transmissive insulating layer and the reflective metal layer, and performing exposing and developing treatments to form the layer of insulating material into a plurality of protective insulating structures that cover the reflective metal layer and extend to the electrode-mounting surface;

forming a conductor-receiving insulating layer on the light-transmissive insulating layer and the protective insulating structures, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least one of the light emitting diode chips.

According to a second aspect of this invention, a method for fabricating light emitting diode packages comprises:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surface, the light-transmissive insulating layer being subjected to exposing and developing treatments to form a plurality of via holes that respectively expose the electrodes of the light emitting diode chips;

forming a reflective metal layer on the light-transmissive insulating layer;

forming a layer of insulating material on the reflective metal layer, and performing exposing and developing treatments to form the layer of insulating material into a plurality of protective insulating structures each of which is positioned on the reflective metal layer corresponding to the n-type electrode region of a respective one of the light emitting diode chips, and each of which has an electrode-exposing hole in communication with a respective one of the via holes that exposes the electrode at the n-type electrode region of the respective one of the light emitting diode chips;

forming a conductor-receiving insulating layer on the reflective metal layer and the protective insulating structures, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least one of the light emitting diode chips.

According to a third aspect of this invention, a method for fabricating light emitting diode packages comprises:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surfaces of the light emitting diode chips, the light-transmissive insulating layer being subjected to exposing and developing treatments to form a plurality of via holes that respectively expose the electrodes of the light emitting diode chips;

forming a conductor-receiving insulating layer on the light-transmissive insulating layer, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least one of the light emitting diode chips;

wherein each of the conductor-receiving holes, which corresponds to the electrode in the p-type electrode region of a respective one of the light emitting diode chips, exposes a portion of the light-transmissive insulating layer on the p-type electrode region of the respective one of the light emitting diode chips so that one of the conductor units formed in the one of the conductor-receiving hole is able to serve as a reflective metal layer According to a fourth aspect of this invention, a light emitting diode package comprises:

a light emitting diode chip including a semiconductor unit that has p-type and n-type electrode regions, and two electrodes that are disposed on an electrode-mounting surface of the semiconductor unit and that are connected respectively and electrically to the p-type and n-type electrode regions;

a light-transmissive insulating layer that is disposed on the electrode-mounting surface and that has two via holes each of which exposes a respective one of the two electrodes;

a reflective metal layer disposed on a portion of the light-transmissive insulating layer corresponding to the p-type electrode region;

a protective insulating structure that is disposed on the reflective metal layer and that extends to the electrode-mounting surface;

a conductor-receiving insulating layer that has two conductor-receiving holes respectively in communication with the via holes; and two conductor units that are formed respectively in the conductor-receiving holes and are connected electrically and respectively to the two electrodes.

According to a fifth aspect of this invention, a light emitting diode package comprises:

a light emitting diode chip including a semiconductor unit that has p-type and n-type electrode regions, and two electrodes that are disposed on an electrode-mounting surface of the semiconductor unit and that are connected respectively and electrically to the p-type and n-type electrode regions;

a light-transmissive insulating layer that is disposed on the electrode-mounting surface and that has two via holes each of which exposes a respective one of the two electrodes;

a reflective metal layer disposed on the light-transmissive insulating layer;

a protective insulating structure that is disposed on a portion of the reflective metal layer corresponding to the n-type electrode region, and that has an electrode-exposing hole to expose one of the electrodes at the n-type electrode region;

a conductor-receiving insulating layer that has two conductor-receiving holes respectively in communication with the via holes; and two conductor units that are formed respectively in the conductor-receiving holes and are connected electrically and respectively to the two electrodes.

According to a sixth aspect of this invention, a light emitting diode package comprises:

a light emitting diode chip including a semiconductor unit that has p-type and n-type electrode regions, and two electrodes that are disposed on an electrode-mounting surface of the semiconductor unit and that are connected respectively and electrically to the p-type and n-type electrode regions;

a light-transmissive insulating layer that is disposed on the electrode-mounting surface and that has two via holes each of which exposes a respective one of the two electrodes;

a conductor-receiving insulating layer that has two conductor-receiving holes respectively in communication with the via holes; and two conductor units that are formed respectively in the conductor-receiving holes and are connected electrically and respectively to the two electrodes.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
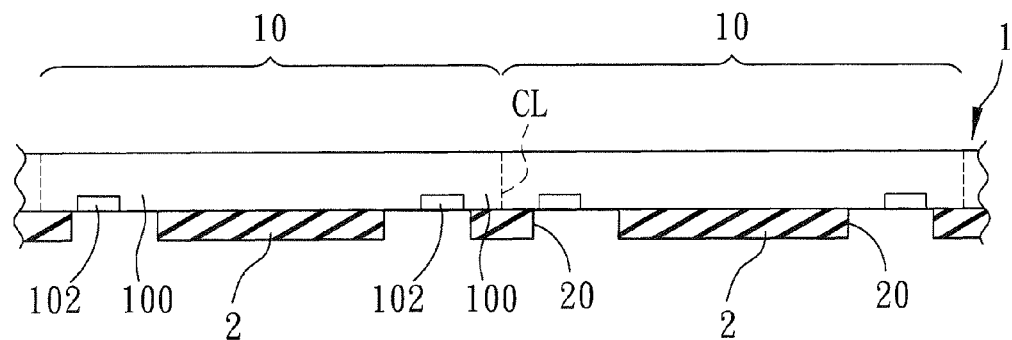
FIGS. 1 to 5 are schematic cross-sectional views illustrating consecutive steps of a method for fabricating light emitting diode packages according to the first preferred embodiment of this invention.

Before the present invention is described in greater detail with reference to the accompanying preferred embodiments, it should be noted herein that like elements are denoted by the same reference numerals throughout the disclosure. Besides, in order to show the features of this invention clearly, the elements shown in the drawings are not drawn in actual scale.

FIGS. 1 to 5 illustrate the first preferred embodiment of a method for fabricating light emitting diode packages according to this invention.

Referring to FIG. 1, a light emitting diode wafer 1 (only a portion of the light emitting diode wafer 1 is shown) is provided. The light emitting diode wafer 1 has a plurality of light emitting diode chips 10. Each of the light emitting diode chips 10 includes a semiconductor unit 100 that has p-type and n-type electrode regions, and at least two electrodes 102 that are disposed on an electrode-mounting surface 101 of the light emitting diode wafer 1 and that are connected respectively and electrically to the p-type and n-type electrode regions. In this embodiment, the electrode-mounting surface 101 of the light emitting diode wafer 1 corresponds to an electrode-mounting surface of each of the light emitting diode chips 10.

Then, a light-transmissive insulating layer 2 is formed on the electrode-mounting surface 101. The light-transmissive insulating layer 2 is subjected to exposing and developing treatments to form a plurality of via holes 20 that respectively expose the electrodes 102 of the light emitting diode chips 10.

Figure 2:
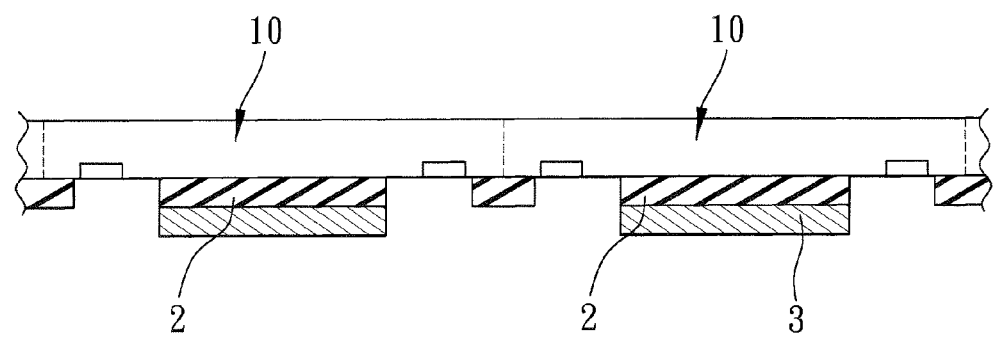

Thereafter, as shown in FIG. 2, a reflective metal layer 3 is formed on a portion of the light-transmissive insulating layer 2 corresponding to the p-type electrode regions of the light emitting diode chips 10.

Figure 3:
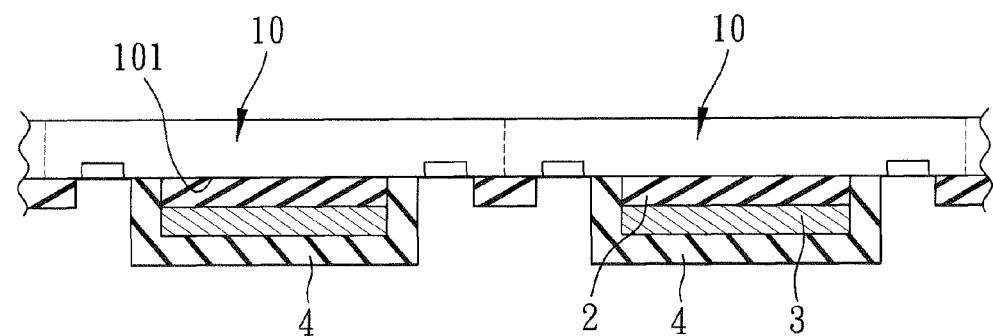

Referring to FIG. 3, a layer of insulating material (not shown) is formed on the light-transmissive insulating layer 2 and the reflective metal layer 3, and exposing and developing treatments are performed to form the layer of insulating material into a plurality of protective insulating structures 4 that cover the reflective metal layer 3 and extend to the electrode-mounting surface 101.

Figure 4:
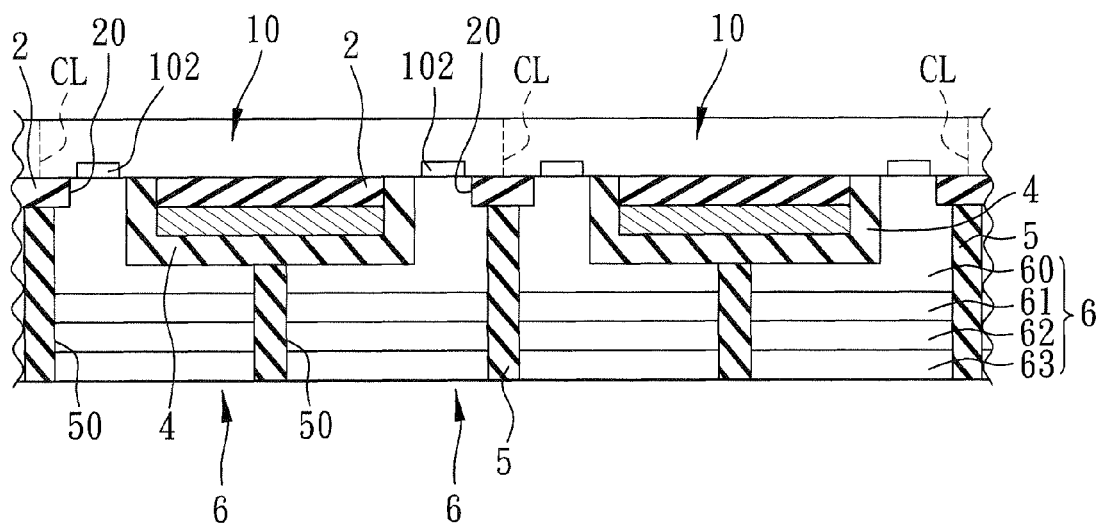

Next, a conductor-receiving insulating layer 5 is formed on the light-transmissive insulating layer 2 and the protective insulating structures 4 (see FIG. 4). The conductor-receiving insulating layer 5 is subjected to exposing and developing treatments to form a plurality of conductor-receiving holes 50 respectively in communication with the via holes 20 of the light-transmissive insulating layer 2. Then, a plurality of conductor units 6 are formed respectively in the conductor-receiving holes 50 to connect respectively and electrically to the electrodes 102 of the light emitting diode chips 10.

Each of the conductor units 6 may be constituted by a single material, or by at least two materials. The selection of the materials of the conductor units 6 should take into consideration the heat-dissipation, electrical conduction, and eutectic properties of the material. In this embodiment, each of the conductor units 6 is constituted by: a first conductor 60 made of a material selected from copper, graphitized diamond, silicon carbide, aluminum, zinc, silver, and the like; a second conductor 61 made of a material selected from chromium, copper, titanium, graphitized diamond, silicon carbide, aluminum, zinc, silver, and the like; a third conductor 62 made of a material selected from nickel, chromium, copper, and the like; and a fourth conductor 63 made of a material selected from nickel, gold, and the like. Preferably, the first conductor 60 is made of a material selected from silver, aluminum, and an alloy thereof; the second conductor 61 is made of a material selected from chromium, titanium, copper, and alloys thereof; the third conductor 62 is made of a material selected from nickel, copper, chromium, and alloys thereof; and the fourth conductor 63 is made of a material selected from nickel, gold, and an alloy thereof.

Figure 5:
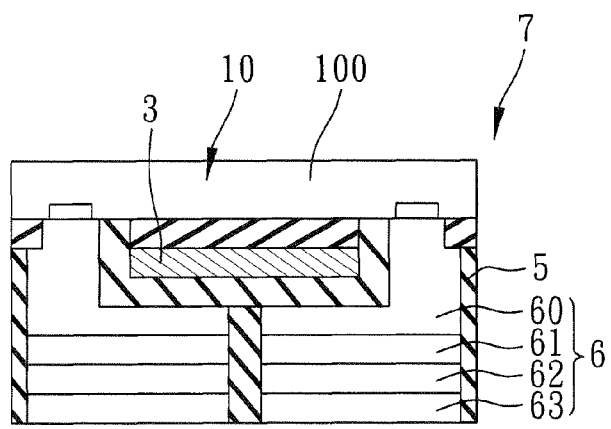

Finally, a cutting process is performed along cutting lines (CL) on the light emitting diode wafer 1 (see FIG. 4) to obtain a plurality of light emitting diode packages 7 (only one is shown in FIG. 5). Each of the light emitting diode packages 7 has at least one of the light emitting diode chips 10.

FIGS. 6 to 9 illustrate the second preferred embodiment of a method for fabricating light emitting diode packages according to this invention.

Figure 6:
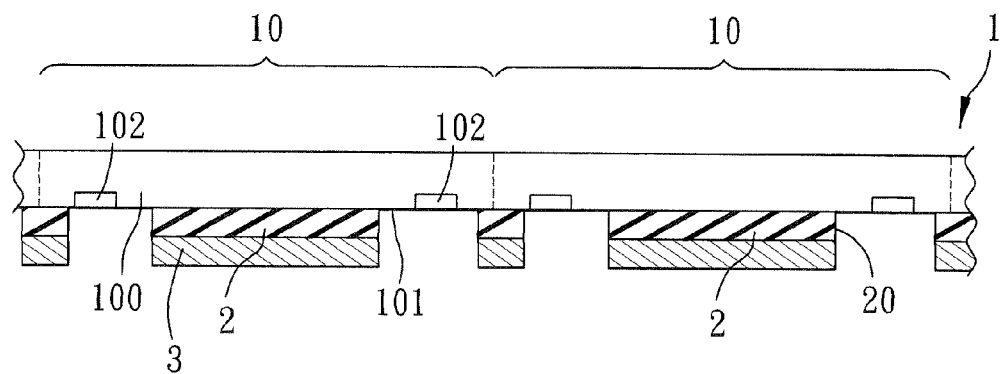
FIGS. 6 to 9 are schematic cross-sectional views illustrating consecutive steps of a method for fabricating light emitting diode packages according to the second preferred embodiment of this invention.

Referring to FIG. 6, a light emitting diode wafer 1 (only a portion of the light emitting diode wafer 1 is shown) is provided. The light emitting diode wafer 1 has a plurality of light emitting diode chips 10. Each of the light emitting diode chips 10 includes a semiconductor unit 100 that has p-type and n-type electrode regions, and at least two electrodes 102 that are disposed on an electrode-mounting surface 101 of the light emitting diode wafer 1 and that are connected respectively and electrically to the p-type and n-type electrode regions. In this embodiment, the electrode-mounting surface 101 of the light emitting diode wafer 1 corresponds to an electrode-mounting surface of each of the light emitting diode chips 10.

Then, a light-transmissive insulating layer 2 is formed on the electrode-mounting surface 101. The light-transmissive insulating layer 2 is subjected to exposing and developing treatments to form a plurality of via holes 20 that respectively expose the electrodes 102 of the light emitting diode chips 10. Thereafter, a reflective metal layer 3 is formed on the light-transmissive insulating layer 2.

Figure 7:
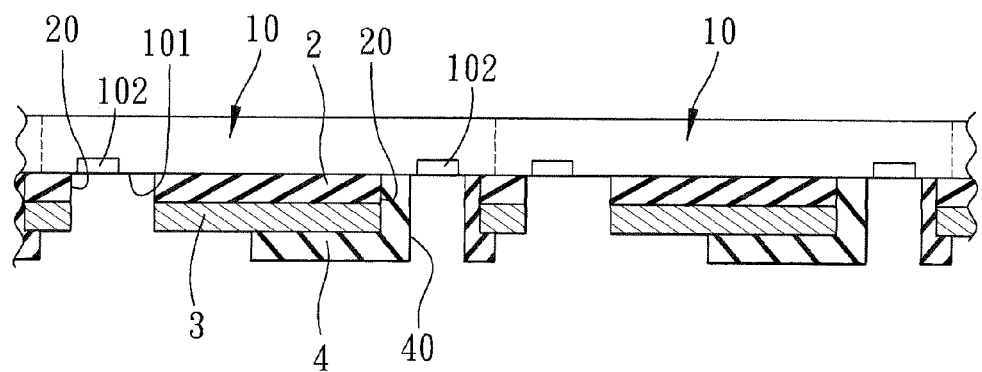

Referring to FIG. 7, a layer of insulating material (not shown) is formed on the reflective metal layer 3, and exposing and developing treatments are performed to form the layer of insulating material into a plurality of protective insulating structures 4. Each of the protective insulating structures 4 is positioned on the reflective metal layer 3 corresponding to the n-type electrode region of a respective one of the light emitting diode chips 10, and has an electrode-exposing hole 90 in communication with a respective one of the via holes 20 that exposes the electrode 102 at the n-type electrode region of the respective one of the light emitting diode chips 10.

Figure 8:
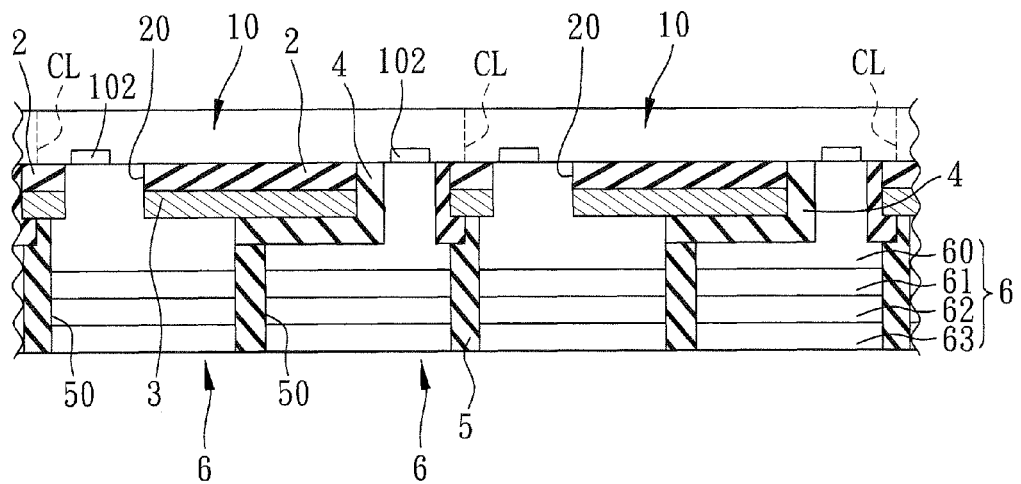

As shown in FIG. 8, a conductor-receiving insulating layer 5 is formed on the reflective metal layer 3 and the protective insulating structures 4. The conductor-receiving insulating layer 5 is subjected to exposing and developing treatments to form a plurality of conductor-receiving holes 50 respectively in communication with the via holes 20 of the light-transmissive insulating layer 2. Thereafter, a plurality of conductor units 6 are formed respectively in the conductor-receiving holes 50 to connect respectively and electrically to the electrodes 102 of the light emitting diode chips 10.

Similar to the first preferred embodiment, each of the conductor units 6 in the second preferred embodiment is constituted by the first to fourth conductors 60, 61, 62, 63. Of course, the conductor units 6 may be constituted by any number of the conductors.

Figure 9:
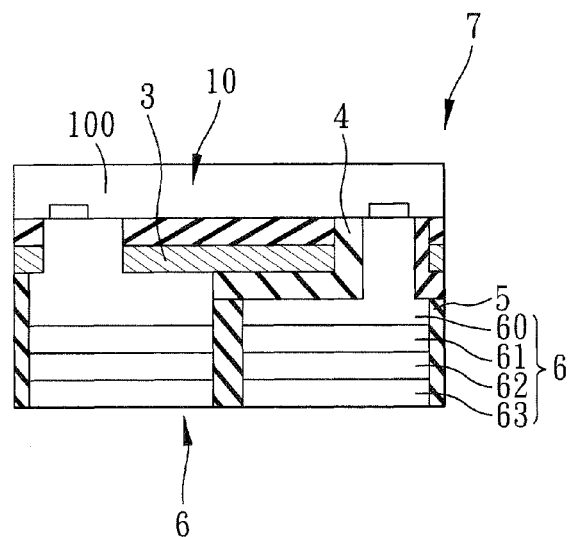

Finally, a cutting process is performed along cutting lines (CL) on the light emitting diode wafer 1 (see FIG. 8) to obtain a plurality of light emitting diode packages 7 (only one is shown in FIG. 9). Each of the light emitting diode packages 7 has at least one of the light emitting diode chips 10.

Figure 10:
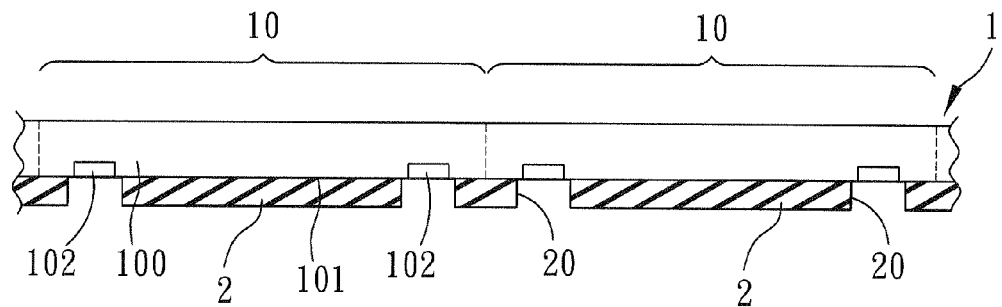
FIGS. 10 to 12 are schematic cross-sectional views illustrating consecutive steps of a method for fabricating light emitting diode packages according to the third preferred embodiment of this invention.
Figure 11:
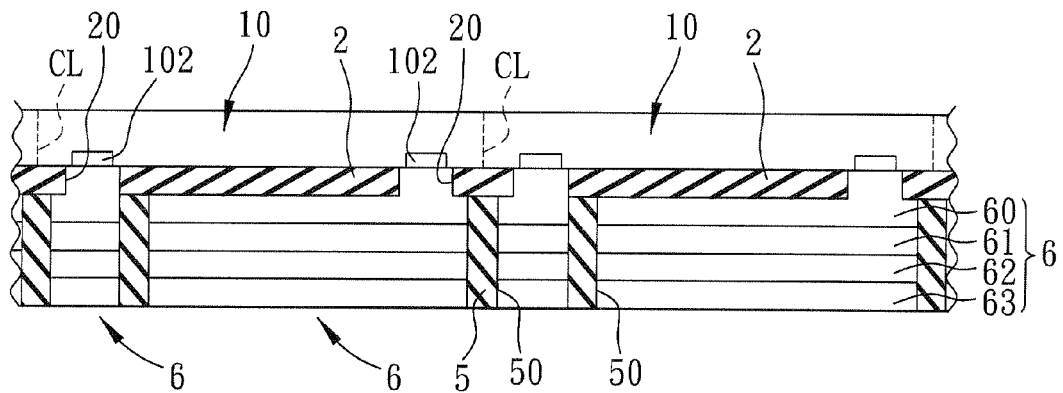
Figure 12:
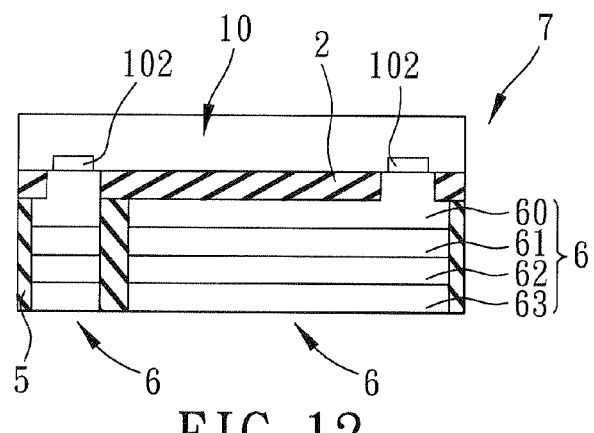

FIGS. 10 to 12 illustrate the third preferred embodiment of a method for fabricating light emitting diode packages according to this invention.

Referring to FIG. 10, a light emitting diode wafer 1 (only a portion of the light emitting diode wafer 1 is shown) is provided. The light emitting diode wafer 1 has a plurality of light emitting diode chips 10. Each of the light emitting diode chips 10 includes a semiconductor unit 100 that has p-type and n-type electrode regions, and at least two electrodes 102 that are disposed on an electrode-mounting surface 101 of the light emitting diode wafer 1 and that are connected respectively and electrically to the p-type and n-type electrode regions. In this embodiment, the electrode-mounting surface 101 of the light emitting diode wafer 1 corresponds to an electrode-mounting surface of each of the light emitting diode chips 10.

Then, a light-transmissive insulating layer 2 is formed on the electrode-mounting surface 101. The light-transmissive insulating layer 2 is subjected to exposing and developing treatments to form a plurality of via holes 20 that respectively expose the electrodes 102 of the light emitting diode chips 10.

Referring to FIG. 11, a conductor-receiving insulating layer 5 is formed on the light-transmissive insulating layer 2. The conductor-receiving insulating layer 5 is subjected to exposing and developing treatments to form a plurality of conductor-receiving holes 50 respectively in communication with the via holes 20 of the light-transmissive insulating layer 2. Thereafter, a plurality of conductor units 6 are formed respectively in the conductor-receiving holes 50 to connect respectively and electrically to the electrodes 102 of the light emitting diode chips 10.

Similar to the first preferred embodiment, each of the conductor units 6 in the third preferred embodiment is constituted by the first to fourth conductors 60, 61, 62, 63. Of course, the conductor units 6 may be constituted by any number of the conductors.

It should be noted that each of the conductor-receiving holes 50, which corresponds to the electrode 102 in the p-type electrode region of a respective one of the light emitting diode chips 10, exposes a portion of the light-transmissive insulating layer 2 on the p-type electrode region of the respective one of the light emitting diode chips 10. Accordingly, one of the conductor units 6 formed in said one of the conductor-receiving hole 50 is able to serve as a reflective metal layer.

Finally, a cutting process is performed along cutting lines (CL) on the light emitting diode wafer 1 (see FIG. 11) to obtain a plurality of light emitting diode packages 7 (only one is shown in FIG. 12). Each of the light emitting diode packages 7 has at least one of the light emitting diode chips 10.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A method for fabricating light emitting diode packages, comprising:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surface, the light-transmissive insulating layer being subjected to exposing and developing treatments to form a plurality of via holes that respectively expose the electrodes of the light emitting diode chips;

forming a reflective metal layer on a portion of the light-transmissive insulating layer corresponding to the p-type electrode regions of the light emitting diode chips;

forming a layer of insulating material on the light-transmissive insulating layer and the reflective metal layer, and performing exposing and developing treatments to form the layer of insulating material into a plurality of protective insulating structures that cover the reflective metal layer and extend to the electrode-mounting surface;

forming a conductor-receiving insulating layer on the light-transmissive insulating layer and the protective insulating structures, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least one of the light emitting diode chips.

2. The method of claim 1, wherein, in the step of forming the conductor units, each of the conductor units is constituted by a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

3. A method for fabricating light emitting diode packages, comprising:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surface, the light-transmissive insulating layer being subjected to exposing and developing treatments to form a plurality of via holes that respectively expose the electrodes of the light emitting diode chips;

forming a reflective metal layer on the light-transmissive insulating layer;

forming a layer of insulating material on the reflective metal layer, and performing exposing and developing treatments to form the layer of insulating material into a plurality of protective insulating structures each of which is positioned on the reflective metal layer corresponding to then-type electrode region of a respective one of the light emitting diode chips, and each of which has an electrode-exposing hole in communication with a respective one of the via holes that exposes the electrode at the n-type electrode region of the respective one of the light emitting diode chips;

forming a conductor-receiving insulating layer on the reflective metal layer and the protective insulating structures, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least one of the light emitting diode chips.

4. The method of claim 3, wherein, in the step of forming the conductor units, each of the conductor units is constituted by a first conductor made of a material selected from silver, aluminum, and an alloy thereof; a second conductor made of a material selected from chromium, titanium, copper, and alloys thereof a third conductor made of a material selected from nickel, copper, chromium, and alloys thereof; and a fourth conductor made of a material selected from nickel, gold, and an alloy thereof.

5. A method for fabricating light emitting diode packages, comprising:

providing a light emitting diode wafer which has a plurality of light emitting diode chips, each of the light emitting diode chips including a semiconductor unit that has p-type and n-type electrode regions, and two electrodes that are disposed on an electrode-mounting surface of the light emitting diode wafer and that are connected respectively and electrically to the p-type and n-type electrode regions;

forming a light-transmissive insulating layer on the electrode-mounting surfaces of the light emitting diode chips, the light-transmissive insulating layer being subjected to exposing and developing treatments to form a plurality of via holes that respectively expose the electrodes of the light emitting diode chips;

forming a conductor-receiving insulating layer on the light-transmissive insulating layer, the conductor-receiving insulating layer being subjected to exposing and developing treatments to form a plurality of conductor-receiving holes respectively in communication with the via holes of the light-transmissive insulating layer;

forming a plurality of conductor units respectively in the conductor-receiving holes to connect respectively and electrically to the electrodes of the light emitting diode chips; and performing a cutting process to obtain a plurality of light emitting diode packages each having at least S one of the light emitting diode chips;

wherein each of the conductor-receiving holes, which corresponds to the electrode in the p-type electrode region of a respective one of the light emitting diode chips, exposes a portion of the light-transmissive insulating layer on the p-type electrode region of the respective one of the light emitting diode chips so that one of the conductor units formed in said one of the conductor-receiving hole is able to serve as a reflective metal layer.

6. The method of claim 5, wherein, in the step of forming the conductor units, each of the conductor units is constituted by a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

7. A light emitting diode package, comprising:
a light emitting diode chip including a semiconductor unit that has p-type and n-type electrode regions, and two electrodes that are disposed on an electrode-mounting surface of said semiconductor unit and that are connected respectively and electrically to said p-type and n-type electrode regions;
a light-transmissive insulating layer that is disposed on said electrode-mounting surface and that has two via holes each of which exposes a respective one of said two electrodes;
a reflective metal layer disposed on a portion of said light-transmissive insulating layer corresponding to said p-type electrode region;
a protective insulating structure that is disposed on said reflective metal layer and that extends to said electrode-mounting surface;
a conductor-receiving insulating layer that has two conductor-receiving holes respectively in communication with said via holes; and
two conductor units that are formed respectively in said conductor-receiving holes and are connected electrically and respectively to said two electrodes.

8. The light emitting diode package of claim 7, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

9. A light emitting diode package, comprising:
a light emitting diode chip including a semiconductor unit that has p-type and n-type electrode regions, and two electrodes that are disposed on an electrode-mounting surface of said semiconductor unit and that are connected respectively and electrically to said p-type and n-type electrode regions;
a light-transmissive insulating layer that is disposed on said electrode-mounting surface and that has two via holes each of which exposes a respective one of said two electrodes;
a reflective metal layer disposed on said light-transmissive insulating layer;
a protective insulating structure that is disposed on a portion of said reflective metal layer corresponding to said n-type electrode region, and that has an electrode-exposing hole to expose one of said electrodes at said n-type electrode region;
a conductor-receiving insulating layer that has two conductor-receiving holes respectively in communication with said via holes; and
two conductor units that are formed respectively in said conductor-receiving holes and are connected electrically and respectively to said two electrodes.

10. The light emitting diode package of claim 9, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, and alloys thereof; and a fourth conductor made of a material selected from nickel, gold, and an alloy thereof.

11. A light emitting diode package, comprising:
a light emitting diode chip including a semiconductor unit that has p-type and n-type electrode regions, and two electrodes that are disposed on an electrode-mounting surface of said semiconductor unit and that are connected respectively and electrically to said p-type and n-type electrode regions;
a light-transmissive insulating layer that is disposed on said electrode-mounting surface and that has two via holes each of which exposes a respective one of said two electrodes;
a conductor-receiving insulating layer that has two conductor-receiving holes respectively in communication with said via holes; and
two conductor units that are formed respectively in said conductor-receiving holes and are connected electrically and respectively to said two electrodes.

12. The light emitting diode package of claim 11, wherein each of said conductor units is constituted by: a first conductor made of a material selected from silver, aluminum, and an alloy thereof; a second conductor made of a material selected from chromium, titanium, copper, and alloys thereof; a third conductor made of a material selected from nickel, copper, chromium, is and alloys thereof; and a fourth conductor made of a material selected from nickel, gold, and an alloy thereof.

* * * * *